US009028952B2

(12) United States Patent
Park et al.

(10) Patent No.: US 9,028,952 B2
(45) Date of Patent: May 12, 2015

(54) MULTILAYERED WEATHERABLE FILM FOR SOLAR CELL

(75) Inventors: Heyoung Suk Park, Seoul (KR); Gwan Hyung Lee, Gyeonggi-do (KR); Cheon Yong Joo, Seoul (KR); Soo Hee Kim, Gyeonggi-do (KR)

(73) Assignee: SKC Co., Ltd., Gyeonggi-Do (KR)

( * ) Notice: Subject to any disclaimer, the term of this patent is extended or adjusted under 35 U.S.C. 154(b) by 313 days.

(21) Appl. No.: 13/122,992

(22) PCT Filed: Oct. 6, 2009

(86) PCT No.: PCT/KR2009/005691
§ 371 (c)(1),
(2), (4) Date: Apr. 7, 2011

(87) PCT Pub. No.: WO2010/041854
PCT Pub. Date: Apr. 15, 2010

(65) Prior Publication Data
US 2011/0192459 A1 Aug. 11, 2011

(30) Foreign Application Priority Data
Oct. 8, 2008 (KR) .................. 10-2008-0098816

(51) Int. Cl.
B32B 7/02 (2006.01)
B32B 27/08 (2006.01)
B32B 27/36 (2006.01)
H01L 31/048 (2014.01)
H01L 31/049 (2014.01)
C08G 63/127 (2006.01)
C08G 63/183 (2006.01)
C08G 63/40 (2006.01)
C08L 67/02 (2006.01)

(52) U.S. Cl.
CPC ............. *B32B 27/36* (2013.01); *B32B 2307/50* (2013.01); *B32B 2307/412* (2013.01); *B32B 7/02* (2013.01); *B32B 2307/518* (2013.01); C08L 67/025 (2013.01); *B32B 27/08* (2013.01); B32B 2457/12 (2013.01); *C08G 63/183* (2013.01); *C08G 63/127* (2013.01); *C08G 63/40* (2013.01); *B32B 2250/42* (2013.01); *H01L 31/049* (2014.12); *B32B 2367/00* (2013.01); *B32B 2250/244* (2013.01); *H01L 31/048* (2013.01); *Y02E 10/50* (2013.01); *Y10S 428/91* (2013.01)

(58) Field of Classification Search
None
See application file for complete search history.

(56) References Cited

U.S. PATENT DOCUMENTS

| 3,914,502 A * | 10/1975 | Hayashi et al. ............ 428/336 |
| 4,599,460 A * | 7/1986 | Toga et al. ................. 568/617 |
| 5,427,842 A * | 6/1995 | Bland et al. ................ 428/213 |
| 5,604,019 A * | 2/1997 | Bland et al. ................ 428/212 |
| 6,037,423 A * | 3/2000 | Nagano et al. ............. 525/438 |
| 6,040,061 A * | 3/2000 | Bland et al. ................ 428/480 |
| 6,535,585 B1 * | 3/2003 | Hanson et al. ............ 379/88.12 |
| 6,815,080 B2 * | 11/2004 | Omori ....................... 428/483 |
| 6,833,428 B1 * | 12/2004 | Kato .......................... 528/301 |
| 7,829,654 B2 * | 11/2010 | Kampf ....................... 528/300 |
| 7,973,124 B2 * | 7/2011 | Maruyama et al. ......... 528/303 |
| 8,017,715 B2 * | 9/2011 | Kinoshita et al. .......... 528/209 |
| 8,053,086 B2 * | 11/2011 | Nishijima et al. .......... 428/516 |
| 2005/0024108 A1 * | 2/2005 | Lin ............................. 327/158 |
| 2006/0111519 A1 * | 5/2006 | Strand et al. ............... 525/444 |
| 2006/0180198 A1 * | 8/2006 | Takamoto et al. ......... 136/255 |

FOREIGN PATENT DOCUMENTS

| EP | 0592284 A2 | | 4/1994 |
| JP | 08-252896 | * | 10/1986 |
| JP | 08-252896 | * | 10/1996 |
| JP | 8252896 A | | 10/1996 |
| JP | 2000-191758 | * | 7/2000 |
| JP | 2000-202904 A | | 7/2000 |
| JP | 2001-342331 | * | 12/2001 |
| JP | 2002134770 A | | 5/2002 |
| JP | 200226354 A | | 8/2003 |
| JP | 2007-118267 | * | 5/2007 |
| JP | 2007118267 A | | 5/2007 |
| JP | 2007-118267 | | 6/2007 |
| JP | 200885270 A | | 10/2009 |
| WO | WO 2007/072748 | * | 6/2007 |

OTHER PUBLICATIONS

International Search Report published Sep. 23, 2010 for PCT/KR2009/005691, filed Oct. 6, 2009.
Written Opinion dated Sep. 14, 2010 for PCT/KR2009/005691, filed Oct. 6, 2009.
English Translation of Korean Office Action dated Oct. 18, 2011 for Korean Application No. 10-2008-0098816.
International Preliminary Report on Patentability dated Jun. 22, 2011 for PCT/KR2009/005691, filed Oct. 6, 2009.

* cited by examiner

*Primary Examiner* — Vivian Chen
(74) *Attorney, Agent, or Firm* — Fleit Gibbons Gutman Bongini & Blanco PL; Martin Fleit; Paul D. Bianco

(57) ABSTRACT

Disclosed is a multilayered weatherable film for a solar cell, which has superior elongation change rate, strength change rate and haze and thus is suitable for use in a solar cell, and includes a hard layer having a polyester or copolyester polymer resin and a soft layer having polybutylene terephthalate containing polytetramethylene ether glycol, which are regularly or irregularly laminated in a multilayer form.

4 Claims, No Drawings

MULTILAYERED WEATHERABLE FILM FOR SOLAR CELL

TECHNICAL FIELD

The present invention relates to a multilayered weatherable film for a solar cell, in which a hard layer having a polyester or copolyester polymer resin and a soft layer having polybutylene terephthalate containing polytetramethylene ether glycol are regularly or irregularly laminated in a multilayer form, and also which is superior in terms of an elongation change rate (%), a strength change rate (%) and a haze (%) and is thus adapted for use in a solar cell.

BACKGROUND ART

Due to the environmental problems and rising oil prices, there has been an increasing demand for clean energy or new renewable energy, rather than petroleum products, which is inexpensive and generates no pollutants. In order to obtain clean energy or new renewable energy, there are many methods of generating energy using solar energy based on solar heat, wind force energy, biomass energy, hydrogen fuel energy, fuel cells, geothermal energy, marine energy, etc. Of them, the method using solar energy has been considered particularly useful as a next-generation energy production method because of the efficiency of energy generation or the degree of completion thereof. The method using solar energy is classified into two types; conversion of solar energy into electrical energy by means of a solar cell module, and conversion of solar energy into thermal energy. In particular, in the case where solar energy is converted into electrical energy using the solar cell module, the solar cell module is used outdoors for a long period of time (10 years or longer), and thus a device for protecting the solar cell module is necessary. As such, this device should essentially be able to withstand a variety of different weather conditions and be heat resistant. Further, the device is required these days to have a function capable of maximizing solar cell performance including increasing light reflectivity, in addition to having the protection function. The device for protecting the solar cell may be provided in diverse forms. Currently available is a film having weatherability and heat resistance. This film is typically disposed under the solar cell and is mainly exemplified by a polyvinyl fluoride (PVF) film containing a fluorine group having high weatherability and heat resistance. However, because the preparation cost of the PVF film is very high, various alternatives therefor have been devised or proposed.

In this regard, Japanese Unexamined Patent Publication Nos. 2008-85270, 2002-26354 and 2002-134770 disclose the use of a polyethylene terephthalate film between the PVF films, and a three-layer coextruded film composed of a film alternative for the PVF film, a film for increasing weatherability and a layer of inorganic material for increasing reflectivity. However, these films are disadvantageous because the elongation change rate thereof is measured to be about 20% in a 50-hour weathering test which is greatly required for a back-surface protective film for a solar cell, and further, is drastically decreased in a 100-hour weathering test.

DISCLOSURE

Technical Problem

Accordingly, the present invention has been made keeping in mind the problems encountered in the related art and the present invention intends to provide a novel weatherable film, which is manufactured using a typical multilayer coextrusion process to ensure superior weatherability and heat resistance and in which specific material is used to ensure superior optical properties and a composition ratio of the film is appropriately controlled.

Technical Solution

An aspect of the present invention provides a multilayered weatherable film for a solar cell, including a hard layer having a polyester or copolyester polymer resin and a soft layer having a polybutylene terephthalate glycol copolymer containing polytetramethylene ether glycol, which are regularly or irregularly laminated in a multilayer form.

Advantageous Effects

According to the present invention, a multilayered weatherable film for a solar cell changes only slightly in length with the passage of time, thus exhibiting superior weatherability, and also has high strength and visible transmittance, resulting in high stability to UV light.

Best Mode

Hereinafter, a detailed description will be given of a weatherable film for a solar cell according to the present invention, including a hard layer having a polyester or copolyester polymer resin and a soft layer having a polybutylene terephthalate (PBT) glycol copolymer containing polytetramethylene ether glycol (PTMEG), which are regularly or irregularly laminated in a multilayer form.

In the weatherable film for a solar cell according to the present invention, the hard layer includes a polyester or copolyester polymer resin. The polymer resin may comprise a polyalkylene terephthalate resin in which an alkylene of the polyalkylene has 1-6 carbons, and preferably is one or more selected from among polyethylene terephthalate (PET) resin and copolymerized PET. The polymer resin may have a crystallinity of 75% or more and preferably 80-95%. If the crystallinity of the polymer resin is less than 75%, strength may be deteriorated. Thus, it is desirable that the above range for crystallinity be maintained.

The PBT glycol copolymer of the soft layer may contain 90 wt % or less and preferably 10-70 wt % of PTMEG based on the total weight of the PBT glycol copolymer. If the amount of PTMEG is greater than 90 wt % based on the total weight of the PBT glycol copolymer, heat resistance may become poor. In contrast, if the amount of PTMEG is less than 10 wt %, durability may become problematic.

Also, the soft layer may include any polymer containing an ester group, in addition to the above PBT glycol copolymer containing PTMEG. Specifically, the soft layer may include not only PBT glycol containing PTMEG but also one or more selected from among polyalkylene ester, polyurethane, and polyacetate.

In the soft layer, an alkylene of the polyalkylene may have 1-10 carbons and preferably 2-4 carbons. An example of the polyalkylene includes polyethylene containing 1,4-cyclohexanedimethanol (CHDM).

In the weatherable film for a solar cell according to the present invention, the hard layer and the soft layer may have a weight ratio (an extrusion rate ratio, kg/hr) of 0.1-100:1, and preferably 1-30:1. If the weight ratio of the hard layer and the soft layer is less than 0.1:1, it is difficult to maintain the strength. In contrast, if the weight ratio thereof exceeds 100:1, weatherability may be problematic. Hence, it is desirable for the weight ratio thereof to fall in the above range.

The weatherable film for a solar cell according to the present invention is manufactured using an extrusion process which is typically used in the art. Specifically, the film is manufactured by passing materials for respective layers through a feedblock thus obtaining a laminate composed of layers alternately stacked, which is then passed through a coextrusion die, thus extruding a sheet. As such, the volume of the extruder may be appropriately controlled so that the hard layer and the soft layer have a weight ratio of 1-30:1. The sheet thus extruded is quenched using a casting roll, thus obtaining a solidified sheet, which is then subjected to electrostatic application in order to make the thickness of the sheet uniform and improve the surface thereof, so that the sheet is adhered closely to the casting roll. As such, the electrostatic application may be performed under conditions of 4-6 kv, which is typically set in the art and is not particularly limited. Thereafter, the sheet is biaxially stretched in the sequence of a longitudinal direction and a transverse direction.

The stretch ratio may be set to 1.2-5 times in both the longitudinal direction and the transverse direction. If the stretch ratio is less than 1.2 times, the strength may be reduced and the thickness will be non-uniform. In contrast, if the stretch ratio exceeds 5 times, the film may break down or the shrinkage rate may be considerably increased. Hence, it is desirable that the stretch ratio fall in the above range.

As mentioned above, the weatherable film for a solar cell according to the present invention, including the hard and soft layers regularly or irregularly laminated in a multilayer form, has a visible transmittance of 80% or more and preferably 85% or more at 50 μm, and a haze of 7% or less and preferably 5% or less. Furthermore, the weatherable film for a solar cell according to the present invention may have a thickness of 5-700 μM, and preferably 50-400 μm. If the thickness of the film is less than 5 μm, weatherability is drastically reduced and electrical insulating properties may become poor. In contrast, if the thickness of the film exceeds 700 μm, weatherability may be increased but many problems related to price, weight, post-processing and so on may be incurred. Hence, it is desirable that the thickness of the film fall in the above range.

MODE FOR INVENTION

A better understanding of the present invention may be obtained through the following examples which are set forth to illustrate, but are not to be construed as limiting the present invention.

EXAMPLE

Formation of Weatherable Film for Solar Cell

Example 1

A PET resin (available from SKC, Korea) having a crystallinity of 75% was dried in a vacuum under conditions of 120° C. and 2 hours or longer and then 180° C. and about 3 hours or longer, melted at 280° C. and then introduced into a feedblock using an extruder. Also, a PBT glycol copolymer containing 60% PTMEG (general Grade) was melted at 240° C. and then introduced into the feedblock using a vacuum bent extruder.

Then, extrusion was performed at about 280° C. using a feedblock coextrusion process so that the weight ratio of the layer of the PET resin and the layer of the PBT glycol copolymer was 20:1, thus manufacturing a 15-layered sheet, which was then subjected to electrostatic application under conditions of 5 kv on a cooling roll at 45° C.

The sheet thus obtained was primarily stretched about 3.5 times in a longitudinal direction at 90° C., coated to increase slip of the surface of the film, and then stretched about 3.8 times in a transverse direction at about 110° C., thus manufacturing a weatherable film having a thickness of 50 μm.

Example 2

A weatherable film for a solar cell having a thickness of 50 μm was manufactured in the same manner as in Example 1, with the exception that extrusion was performed so that the weight ratio of the hard layer and the soft layer was 1:1.

Example 3

A weatherable film for a solar cell having a thickness of 50 μm was manufactured in the same manner as in Example 1, with the exception that extrusion was performed so that the weight ratio of the hard layer and the soft layer was 5:1.

Comparative Example 1

A weatherable film for a solar cell having a thickness of 50 μm was manufactured in the same manner as in Example 1, with the exception that PET glycol containing 10-70% CHDM was used in lieu of the PBT glycol copolymer of the soft layer, and extrusion was performed so that the weight ratio of the hard layer ad the soft layer was 20:1.

Comparative Example 2

A weatherable film for a solar cell having a thickness of 50 μm was manufactured in the same manner as in Comparative Example 1, with the exception that extrusion was performed so that the weight ratio of the hard layer and the soft layer was 1:1.

Comparative Example 3

A weatherable film for a solar cell having a thickness of 50 μm was manufactured in the same manner as in Comparative Example 1, with the exception that extrusion was performed so that the weight ratio of the hard layer and the soft layer was 5:1.

Comparative Example 4

A weatherable film for a solar cell having a thickness of 50 μm was manufactured in the same manner as in Comparative Example 1, with the exception that polyethylene naphthalate was used in lieu of the PET resin, and extrusion was performed so that the weight ratio of the hard layer and the soft layer was 20:1.

Comparative Example 5

A weatherable film for a solar cell having a thickness of 50 μm was manufactured in the same manner as in Comparative Example 1, with the exception that polymethylmethacrylate was used in lieu of the PET resin, and extrusion was performed so that the weight ratio of the hard layer and the soft layer was 20:1.

Comparative Example 6

A weatherable film for a solar cell having a thickness of 50 μm was manufactured in the same manner as in Comparative Example 1, with the exception that a copolymerized PET resin having a crystallinity of 70% was used in lieu of the PET resin, and extrusion was performed so that the weight ratio of the hard layer and the soft layer was 20:1.

Comparative Example 7

A PET resin (available from SKC) having a crystallinity of 75% was dried in a vacuum under conditions of 120° C. and 2 hours or longer and then 180° C. and about 3 hours or longer, melted at 280° C. and then passed through an extruder, thus manufacturing a sheet.

Also, the sheet was then subjected to electrostatic application under conditions of 5 kv on a cooling roll at 45° C.

The sheet thus obtained was primarily stretched about 3.5 times in a longitudinal direction at 100° C., coated to increase slip of the surface of the film, and then stretched about 3.8 times in a transverse direction at about 110° C., thus manufacturing a monolayered film having a thickness of 50 μm.

Comparative Examples 8-11

Respective monolayered films having a thickness of 50 μm were manufactured in the same manner as in Comparative Example 7, with the exception that a polyethylene naphthalate (PEN) resin for Comparative Example 8, a polymethylmethacrylate (PMMA) resin for Comparative Example 9, a PBT glycol copolymer resin containing 60% PTMEG (general Grade) for Comparative Example 10, and a PET glycol copolymer resin having a crystallinity of 70% for Comparative Example 11, were used respectively, and a typical extrusion process was performed. The results are shown in Table 1 below.

Experimental Example

Measurement of Properties

The properties of the weatherable film for a solar cell manufactured in each of Examples 1-3 and Comparative Examples 1-11 were measured as follows. The results are shown in Table 2 below.

Elongation Change Rate

The film was aged for 50 hours under conditions of 120° C. and 2 atm, and the elongation at break thereof was measured according to ASTM D 882. As such, the elongation at break of a film which was not aged was determined to be 100%.

Strength Change Rate

The film was aged for 50 hours under conditions of 120° C. and 2 atm, and the elongation at break thereof was measured according to ASTM D 882. As such, the elongation at break of a film which was not aged was determined to be 100%.

Visible Transmittance

The film was cut to a size of 21.0 cm wide and 29.7 cm long and then impurities were removed from the surface thereof, after which the transmittance thereof was measured using a light transmittance meter. As such, the unit is represented by % (ASTM D 1003 Mode).

Haze

The film was cut to a size of 21.0 cm wide and 29.7 cm long and then impurities were removed from the surface thereof, after which the haze thereof was measured using a haze meter. As such, the unit is represented by % (ASTM D 1003 Mode).

TABLE 1

| | Hard Layer PET[1] | Soft Layer PBT Glycol Copolymer | Soft Layer PET Glycol[2] | Soft Layer PEN[3] | Soft Layer PMMA[4] | Soft Layer PET[5] | Weight Ratio of Hard Layer to Soft Layer | Number of Layers |
|---|---|---|---|---|---|---|---|---|
| Ex. 1 | ○ | ○ | — | — | — | — | 20:1 | 15 |
| Ex. 2 | ○ | ○ | — | — | — | — | 1:1 | 15 |
| Ex. 3 | ○ | ○ | — | — | — | — | 5:1 | 15 |
| C. Ex. 1 | ○ | — | ○ | — | — | — | 20:1 | 15 |
| C. Ex. 2 | ○ | — | ○ | — | — | — | 1:1 | 15 |
| C. Ex. 3 | ○ | — | ○ | — | — | — | 5:1 | 15 |
| C. Ex. 4 | ○ | — | — | ○ | — | — | 20:1 | 15 |
| C. Ex. 5 | ○ | — | — | — | ○ | — | 20:1 | 15 |
| C. Ex. 6 | ○ | — | — | — | — | ○ | 20:1 | 15 |
| C. Ex. 7 | ○ | — | — | — | — | — | monolayer | |
| C. Ex. 8 | — | — | — | ○ | — | — | monolayer | |
| C. Ex. 9 | — | — | — | — | ○ | — | monolayer | |
| C. Ex. 10 | — | ○ | — | — | — | — | monolayer | |
| C. Ex. 11 | — | — | — | — | — | ○ | monolayer | |

Note:
[1] PET: polyethylene terephthalate having MW of 20,000-40,000
[2] PET glycol: polyethylene terephthalate glycol containing at least 10% CHDM
[3] PEN: polyethylene naphthalate
[4] PMMA: polymethylmethacrylate
[5] PET: copolymerized polyethylene terephthalate having crystallinity of 70%

TABLE 2

| | Process | Weight Ratio of Hard Layer to Soft Layer | Elongation Change Rate (%) | Strength Change Rate (%) | Visible Transmittance (%) | Haze (%) |
|---|---|---|---|---|---|---|
| Ex. 1 | Multilayer | 20:1 | 90 | 100 | 88 | 0.7 |
| Ex. 2 | Co- | 1:1 | 99 | 100 | 85 | 1.2 |
| Ex. 3 | extrusion | 5:1 | 96 | 100 | 86 | 1.1 |
| C. Ex. 1 | | 20:1 | 50 | 90 | 88 | 0.7 |
| C. Ex. 2 | | 1:1 | 65 | 100 | 88 | 0.8 |
| C. Ex. 3 | | 5:1 | 62 | 95 | 88 | 0.7 |
| C. Ex. 4 | | 20:1 | 90 | 100 | 88 | 3.0 |
| C. Ex. 5 | | 20:1 | 40 | 40 | 90 | 0.5 |
| C. Ex. 6 | | 20:1 | 40 | 40 | 82 | 0.8 |
| C. Ex. 7 | Typical | 1 | 40 | 40 | 90 | 0.6 |
| C. Ex. 8 | Extrusion | 1 | 100 | 100 | 87 | 6.0 |
| C. Ex. 9 | | 1 | 35 | 40 | 91 | 0.5 |
| C. Ex. 10 | | 1 | 100 | 100 | 80 | 1.4 |
| C. Ex. 11 | | 1 | 40 | 40 | 82 | 0.8 |

As is apparent from Table 2 showing the results of measurement of the properties of the weatherable films of the examples and comparative examples, compared to the films of Comparative Examples 7-11 in multilayer or monolayer form which were conventionally used as a film for a solar cell and which were used herein for comparative purposes, the films of Examples 1-3 in a multilayer form could be seen to exhibit superior elongation change rate (=elongation maintenance rate) and strength change rate (=strength maintenance rate), resulting in better weatherability. Also, the films of Comparative Examples 4, 8, 10 had an elongation change rate equal or superior to that of the films of Examples 1-3. However, when a weatherable film for a solar cell was manufactured from the films of Comparative Examples 4, 8, 10, the manufacturing cost was expected to increase at least five times more than when using the film of Examples 1-3, thus negating economic benefits.

The films of Comparative Examples 1-3 could be seen to have low haze but a reduced elongation change rate. The film of Comparative Example 4 had strength and elongation change rates of 90% or more which was evaluated to be good, but there were problems related to price and process. The films of Comparative Examples 5, 6 had considerably decreased elongation and strength change rates.

The films of Comparative Examples 7, 9, 11 had no process problems, but had remarkably decreased elongation and strength change rates. Also, as mentioned above, the films of Comparative Examples 8, 10 had price and process stability inferior to those of the films of Examples 1-3.

Therefore, the film according to the present invention can be confirmed to be adapted for commercial use as a film for a solar cell, thanks to superior weatherability and heat resistance.

The invention claimed is:

1. A weatherable film for a solar cell, consisting of: a hard layer and a soft layer laminated and alternately stacked in a multilayer form with said hard layer and said soft layer each contained in said multilayer form multiple times, wherein the hard layer consists essentially of a polyester or copolyester polymer resin having a crystallinity of 75-95% and the soft layer consists essentially of a polybutylene terephthalate glycol copolymer containing 10-60wt % of polytetramethylene ether glycol; wherein the hard layer and the soft layer have a weight ratio (an extrusion rate ratio, kg/hr) of 0.1-100:1; wherein the film has been extruded and stretched 1.5-5.0 times in a longitudinal direction and a transverse direction; wherein the film has a thickness of 5-700 μm; wherein the film has an elongation change rate of 20-90% in a hydrolysis resistance test; and wherein the film has a visible transmittance of 80-95% and a haze of 0.1-5%.

2. The weatherable film according to claim 1, wherein the polymer resin has a crystallinity of 80-95%; a weight ratio of 1-30:1; a visible transmittance of 85-95%; and a thickness of 50-400 μm.

3. The weatherable film according to claim 1, wherein the film has a thickness of 50 μm.

4. The weatherable film according to claim 1, wherein the film contains 15 layers alternately stacked in a multilayer form.

* * * * *